United States Patent
Josyula et al.

(10) Patent No.: US 12,401,312 B2
(45) Date of Patent: Aug. 26, 2025

(54) SENSOR-LESS TEMPERATURE MONITORING

(71) Applicant: Hamilton Sundstrand Corporation, Charlotte, NC (US)

(72) Inventors: Anil Prasad Josyula, Andhra Pradesh (IN); Ashish Vijay, Rajasthan (IN); Sangameswaran Kamanathan, Tamil Nadu (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 150 days.

(21) Appl. No.: 18/321,057

(22) Filed: May 22, 2023

(65) Prior Publication Data
US 2024/0322736 A1   Sep. 26, 2024

(30) Foreign Application Priority Data

Mar. 23, 2023   (IN) .............................. 202311020306

(51) Int. Cl.
   *H02P 29/60*   (2016.01)
   *H02K 11/25*   (2016.01)
   *H02K 11/33*   (2016.01)

(52) U.S. Cl.
   CPC .............. *H02P 29/60* (2016.02); *H02K 11/25* (2016.01)

(58) Field of Classification Search
   CPC .... H02K 11/25; H02K 11/0094; H02K 11/33; H02P 29/60
   See application file for complete search history.

(56) References Cited

U.S. PATENT DOCUMENTS

| | | | |
|---|---|---|---|
| 8,358,094 B2 | 1/2013 | Zettner | |
| 8,649,179 B2* | 2/2014 | Hershberger | H10N 10/17 62/3.2 |
| 9,018,878 B2* | 4/2015 | Hendrickson | B60L 15/007 318/471 |
| 10,036,579 B2 | 7/2018 | Ludwig | |
| 10,636,725 B2* | 4/2020 | Van Dan Elzen | H10N 10/13 |
| 11,851,197 B2* | 12/2023 | Yajima | B64U 30/20 |
| 2017/0094841 A1* | 3/2017 | Towner | H05K 7/20745 |
| 2017/0252815 A1 | 9/2017 | Fontana et al. | |

(Continued)

FOREIGN PATENT DOCUMENTS

| | | |
|---|---|---|
| CN | 208847348 U | 5/2019 |
| JP | 2020093706 A | 6/2020 |

OTHER PUBLICATIONS

Lee et al., "High-Endurance UAV via Parasitic Weight Minimization and Wireless Energy Harvesting" 2021 IEEE Conference on Technologies for Sustainability (SusTech). IEEE, (Apr. 2021) pp. 1-7.

(Continued)

*Primary Examiner* — Thai T Dinh
(74) *Attorney, Agent, or Firm* — CANTOR COLBURN LLP (57) ABSTRACT

A motor temperature control system for an electric aircraft is provided. The motor temperature control system includes an electric motor, circuitry and a thermoelectric generator (TEG). The TEG is disposed in thermal communication with the electric motor. The TEG is electrically coupled to the circuitry such that heat generated by the electric motor is converted by the TEG to electrical energy that generates a voltage drop across the circuitry.

18 Claims, 5 Drawing Sheets

(56) References Cited

U.S. PATENT DOCUMENTS

| | | | | |
|---|---|---|---|---|
| 2018/0324981 A1* | 11/2018 | Murakami | ............... | H05K 7/20 |
| 2021/0323688 A1* | 10/2021 | Yajima | .................... | F04D 25/02 |
| 2022/0128594 A1 | 4/2022 | Murata et al. | | |
| 2022/0166368 A1* | 5/2022 | Vijay | .................... | B64D 31/00 |

OTHER PUBLICATIONS

Search Report issued in European Patent Application No. 24165601.6; Application Filing Date Mar. 22, 2024; Date of Mailing Aug. 5, 2024 (9 pages).

* cited by examiner

SENSOR-LESS TEMPERATURE MONITORING

CROSS-REFERENCE TO RELATED APPLICATIONS

This application claims the benefit of Indian Patent Application No. 202311020306 filed Mar. 23, 2023, the disclosure of which is incorporated herein by reference in its entirety.

BACKGROUND

The present disclosure relates to sensor-less temperature monitoring and, in particular, to sensor-less temperature monitoring and energy harvesting using thermoelectric material.

An electric aircraft is an aircraft powered by electricity. Electric aircraft may provide reductions in environmental effects of aviation, through zero emissions and quieter flights. The electricity can be supplied from a variety of sources and by a variety of methods, the most common being batteries. The electricity drives electric motors that in turn drive propellers or turbines.

A need remains for improved aircraft electrical systems, including temperature monitoring systems.

SUMMARY

According to an aspect of the invention, a motor temperature control system for an electric aircraft is provided. The motor temperature control system includes an electric motor, circuitry and a thermoelectric generator (TEG). The TEG is disposed in thermal communication with the electric motor. The TEG is electrically coupled to the circuitry such that heat generated by the electric motor is converted by the TEG to electrical energy that generates a voltage drop across the circuitry.

In accordance with additional or alternative embodiments, the electric motor drives at least one of aircraft flight controls, aircraft fuel pumps, aircraft oil pumps, aircraft cooling pumps, aircraft landing systems, aircraft cargo management systems and aircraft air management systems.

In accordance with additional or alternative embodiments, the electric motor includes a stator housing on which the TEG is mounted.

In accordance with additional or alternative embodiments, the motor temperature control system further includes an electric load disposed along the circuitry.

In accordance with additional or alternative embodiments, the electric load includes at least one of on-board aircraft sensors, an aircraft direct current (DC) bus and an aircraft battery.

In accordance with additional or alternative embodiments, the motor temperature control system includes at least one of a current sensor and a voltage sensor disposed along the circuitry and a controller operably coupled to the at least one of the current sensor and the voltage sensor and configured to determine a temperature of the electric motor based on readings of the at least one of the current sensor and the voltage sensor and to adjust an operation of the electric motor in accordance with the temperature.

In accordance with additional or alternative embodiments, the TEG includes one or more TEG generator elements and each of the one or more TEG generator elements includes a hot side to abut the electric motor, a cold side opposite the hot side and a P-N junction electrically coupled to the circuitry and arranged between the hot side and the cold side to generate voltage to be applied to the circuitry in response to a temperature gradient between the hot side and the cold side.

In accordance with additional or alternative embodiments, the TEG includes multiple TEG generator elements in series.

In accordance with additional or alternative embodiments, the TEG includes multiple TEG generator elements in parallel.

In accordance with additional or alternative embodiments, the TEG includes multiple TEG generator elements and multiple switches electrically interposed between the multiple TEG generator elements. The multiple switches are independently operable to arrange at least one or more of the multiple TEG generator elements in series and to arrange at least one or more of the multiple TEG generator elements in parallel.

According to an aspect of the disclosure, a motor temperature control system for an electric aircraft is provided. The motor temperature control system includes an electric motor disposed on an aircraft to drive at least one of aircraft flight controls, aircraft fuel pumps, aircraft oil pumps, aircraft cooling pumps, aircraft landing systems, aircraft cargo management systems and aircraft air management systems. The motor temperature control system further includes circuitry, an electric load disposed along the circuitry, the electric load comprising at least one of on-board aircraft sensors, an aircraft direct current (DC) bus and an aircraft battery and a thermoelectric generator (TEG). The TEG is disposed in thermal communication with the electric motor. The TEG is electrically coupled to the circuitry such that heat generated by the electric motor is converted by the TEG to electrical energy that generates a voltage drop across the circuitry.

In accordance with additional or alternative embodiments, the electric motor includes a stator housing on which the TEG is mounted.

In accordance with additional or alternative embodiments, the motor temperature control system includes at least one of a current sensor and a voltage sensor disposed along the circuitry and a controller operably coupled to the at least one of the current sensor and the voltage sensor and configured to determine a temperature of the electric motor based on readings of the at least one of the current sensor and the voltage sensor and to adjust an operation of the electric motor in accordance with the temperature.

In accordance with additional or alternative embodiments, the TEG includes one or more TEG generator elements and each of the one or more TEG generator elements includes a hot side to abut the electric motor, a cold side opposite the hot side and a P-N junction electrically coupled to the circuitry and arranged between the hot side and the cold side to generate voltage to be applied to the circuitry in response to a temperature gradient between the hot side and the cold side.

In accordance with additional or alternative embodiments, the TEG includes multiple TEG generator elements in series.

In accordance with additional or alternative embodiments, the TEG includes multiple TEG generator elements in parallel.

In accordance with additional or alternative embodiments, the TEG includes multiple TEG generator elements and multiple switches electrically interposed between the multiple TEG generator elements. The multiple switches are independently operable to arrange at least one or more of the multiple TEG generator elements in series and to arrange at least one or more of the multiple TEG generator elements in parallel.

According to an aspect of the disclosure, a method of motor temperature control for an electric aircraft is provided. The method includes operating an electric motor and disposing a thermoelectric generator (TEG) in thermal communication with the electric motor and electrically coupling the TEG to circuitry such that heat generated by the electric motor is converted by the TEG to electrical energy that generates a voltage drop across the circuitry.

In accordance with additional or alternative embodiments, the method further includes harvesting the electrical energy for operating at least one of on-board aircraft sensors, an aircraft direct current (DC) bus and an aircraft battery.

In accordance with additional or alternative embodiments, the method further includes sensing at least one of current applied to the circuitry and the voltage drop across the circuitry, determining a temperature of the electric motor based on results of the sensing and adjusting an operation of the electric motor in accordance with the temperature.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

The concept of fully electric aircraft (FEA) has been around for quite some time. To achieve FEA, the idea of more electric aircraft (MEA) has emerged, which is practical for the current scenario. In MEA, functionality that was previously achieved using pneumatic and hydraulic systems is now replaced fully or partially by an electric system. A few systems where we can apply the electrification include, but are not limited to, flight controls, fuel pumps, oil pumps, cooling pumps, landing systems, cargo management systems, air management systems, etc.

In many of these systems, an integral part of an electrified system is the motor and controller along with other components like feedback and monitoring sensors, mechanical connections, etc. In most cases, the motor includes a stator housing, a stator core, a stator winding, a rotor and a shaft and bearing. Torque is generated due to the interaction of rotor flux and stator flux. During torque generation, heat energy is generated due to losses. Hence, for thermal management of a motor, the stator housing is used (for air-cooled motors, the stator housing is the only means of heat dissipation). Conventionally, temperature of the stator housing is measured using a dedicated sensor for monitoring purposes.

As will be described below, sensor-less temperature monitoring of a motor is provided for improved thermal management of the motor and for reducing an overall weight and size of the motor. This is achieved by use of a thermoelectric generator (TEG) material. The TEG material can generate a potential across its terminals when it is exposed to heat generated by the motor. This voltage can be indicative of a temperature of the motor and can be used for other electric systems. When the voltage is indicative of an overheat problem with the motor, mitigation actions can be taken.

Figure 1:
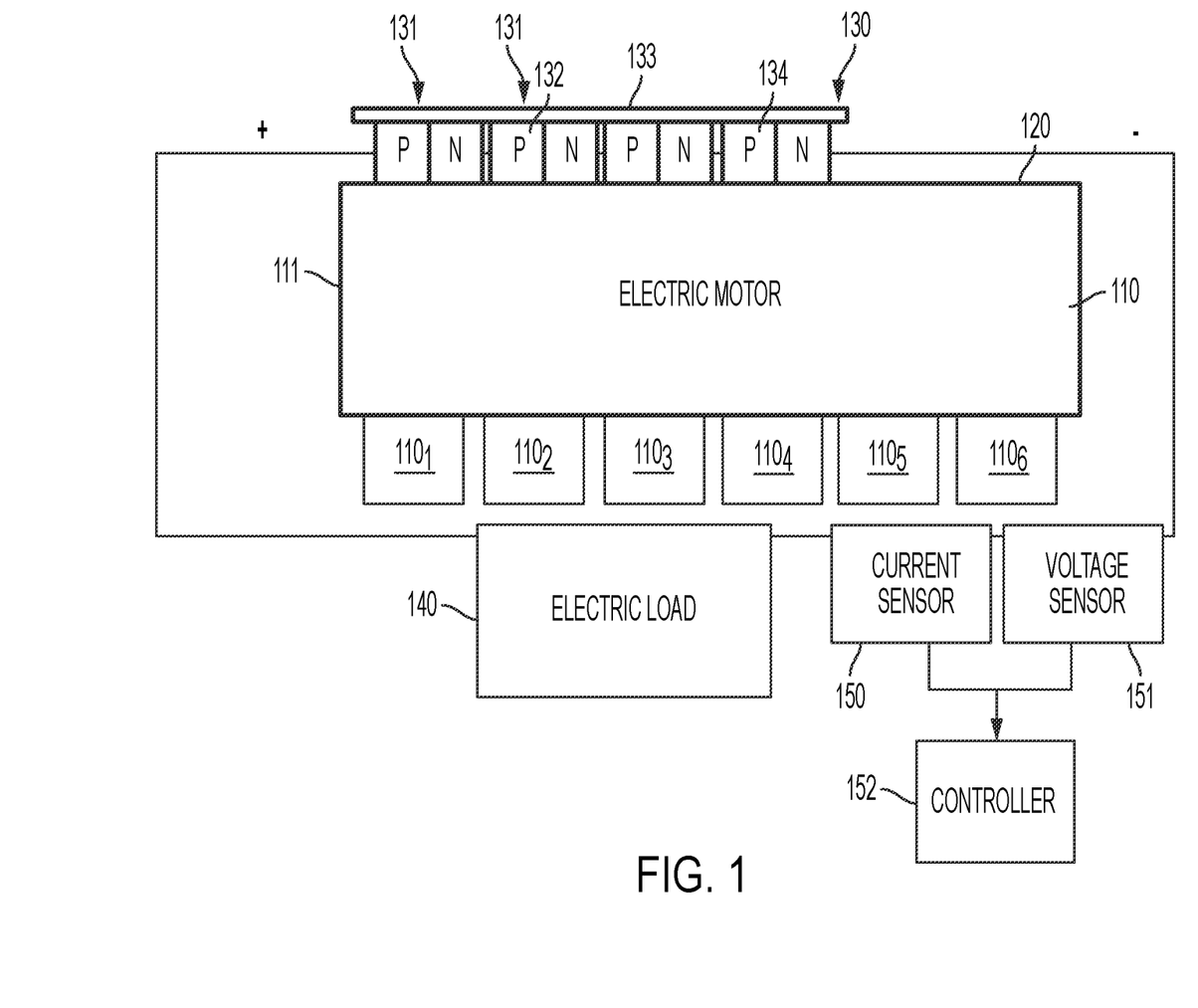
FIG. 1 is a schematic diagram of a motor temperature control system in accordance with embodiments.

With reference to FIG. 1, a motor temperature control system 101 is provided for a fully electric aircraft or for a partially/mostly electric aircraft. The motor temperature control system 101 includes an electric motor 110, circuitry 120 and a TEG 130. The electric motor 110, as is generally well-known, includes a stator housing 111, a stator core, a stator winding, a rotor and shaft and bearing. The electric motor 110 can be operated to drive operations of at least one of aircraft flight controls 1101, aircraft fuel pumps 1102, aircraft oil pumps 1103, aircraft cooling pumps 1104, aircraft landing systems 1105, aircraft cargo management systems 1105 and aircraft air management systems 1106, etc. As the electric motor 110 operates, torque for driving the operations listed above is generated due to interactions between rotor flux and stator flux. The generation of torque produces heat, which increases a temperature of at least the stator housing 111. While the stator housing 111 can be configured to lose a portion of this heat to surroundings, additional thermal control is necessary and provided by at least the TEG 130. The TEG 130 is disposed in thermal communication with the electric motor 110 (i.e., the TEG 130 can be mounted to an exterior surface of the stator housing 111) and is electrically coupled to the circuitry 120. A significant portion of the heat generated by the electric motor 110 is converted by the TEG 130 to electrical energy. This electrical energy generates a voltage drop across the circuitry 120, which can serve to cool the electric motor 110, and can be sensed to determine a temperature of the electric motor 110 for mitigation actions.

Figure 2:
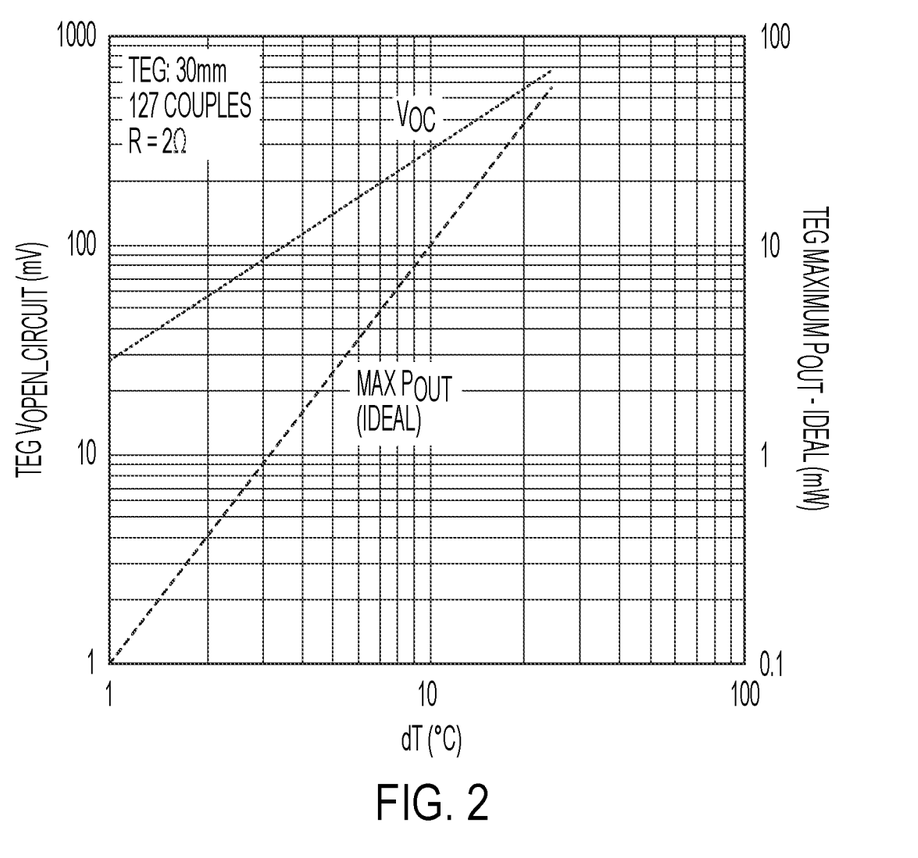
FIG. 2 is a graphical illustration of an operation of a thermoelectric generator (TEG) of the motor temperature control system of FIG. 1 in accordance with embodiments.

With reference to FIG. 2, an operation of the TEG 130 is illustrated. As shown in FIG. 2, a voltage drop associated with the TEG 130 increases generally linearly with exposure to increased heat, such as the heat generated by the electric motor 110.

With reference back to FIG. 1, the motor temperature control system 101 further includes an electric load 140 disposed along the circuitry 120. The electric load 140 can include at least one of on-board aircraft sensors, an aircraft direct current (DC) bus and an aircraft battery. In any case, the electric load 140 can be electrically powered by the electrical energy generated by the TEG 130. In addition, the motor temperature control system 110 can also include at least one of a current sensor 150 and a voltage sensor 151 disposed along the circuitry 120 as well as a controller 152. This controller 152 can be operably coupled to the at least one of the current sensor 150 and the voltage sensor 151 and can be configured to determine a temperature of the electric motor 110 based on readings of the at least one of the current sensor 150 and the voltage sensor 151 and to adjust an operation of the electric motor 110 in accordance with the temperature.

For example, in an event the readings of the at least one of the current sensor 150 and the voltage sensor 151 indicate that the electric motor 110 is overheated, the controller 152 can shut down the electric motor 110 via a switch or relay. In another example, in an event the readings of the at least one of the current sensor 150 and the voltage sensor 151 indicate that a temperature of the electric motor 110 is increasing or escalated without being overheated, the controller 152 can adjust a duty cycle of the electric motor 110 via a proportional integral (PI) controller or another similar device.

Figure 3:
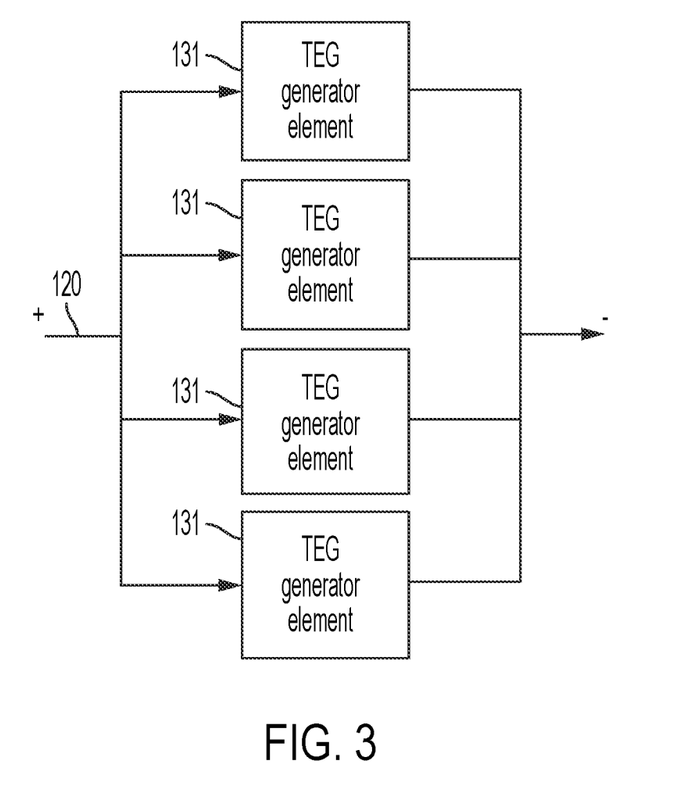
FIG. 3 is a schematic diagram of a parallel arrangement of thermoelectric generator (TEG) elements in accordance with embodiments.
Figure 4:
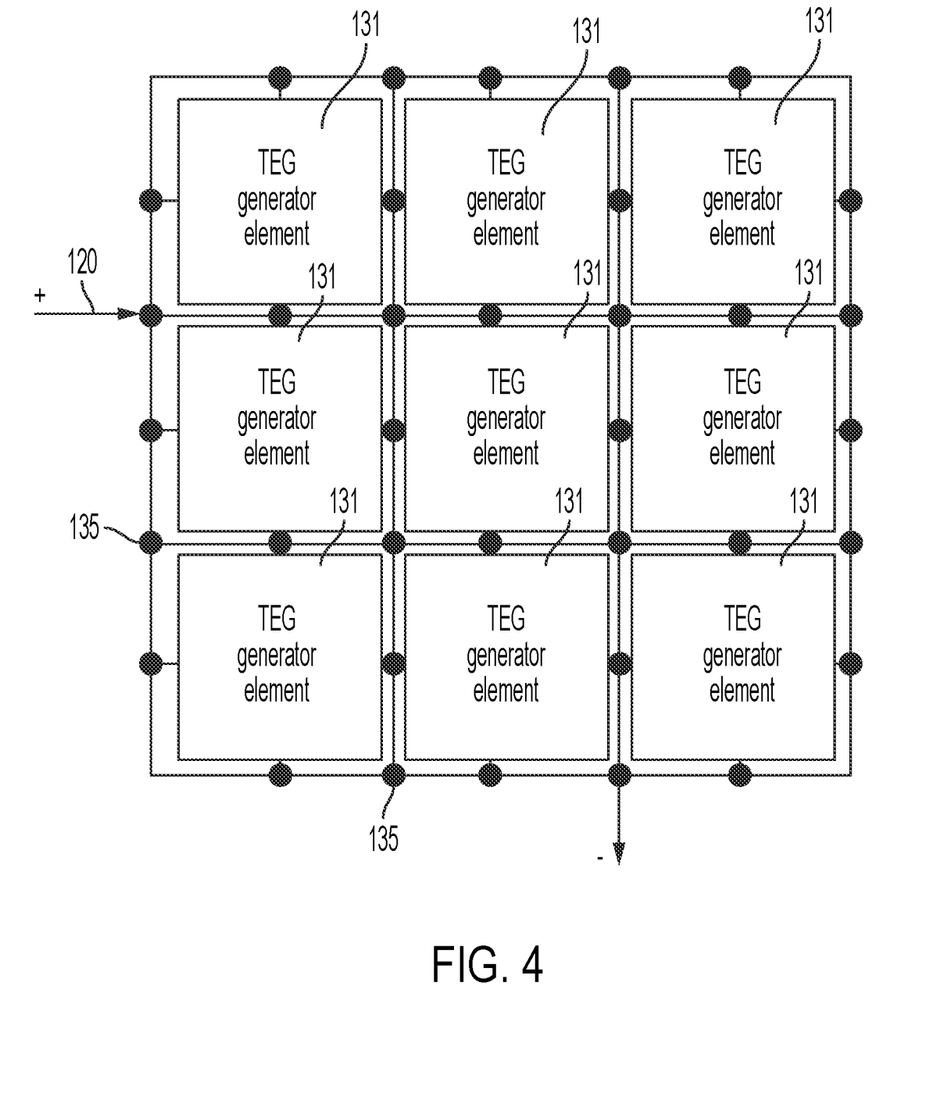
FIG. 4 is a schematic diagram of an adjustable arrangement of thermoelectric generator (TEG) elements in accordance with embodiments.

With continued reference to FIG. 1 and with additional reference to FIGS. 3 and 4, the TEG 130 includes one or more TEG generator elements 131. Each of the one or more TEG generator elements 131 includes a hot side 132 to abut the electric motor 110 (i.e., to be mounted to the exterior surface of the stator housing 111), a cold side 133 opposite the hot side 132 and a P-N junction 134. The P-N junction 134 is electrically coupled to the circuitry 120 and is arranged between the hot side 132 and the cold side 133 to generate a voltage to be applied to the circuitry 120 in response to a temperature gradient between the hot side 132 and the cold side 133.

As shown in FIG. 1, the TEG 130 can include multiple TEG generator elements 131 that are arranged in series along the circuitry 120. As shown in FIG. 3, the TEG 130 can include multiple TEG generator elements 131 that are arranged in parallel along the circuitry 120. As shown in FIG. 4, the TEG 130 can include multiple TEG generator elements 131 and multiple switches 135. The multiple switches 135 are electrically interposed between the multiple TEG generator elements 131. The multiple switches 135 can be independently operable to arrange at least one or more of the multiple TEG generator elements 131 in series and to arrange at least one or more of the multiple TEG generator elements 131 in parallel.

Figure 5:
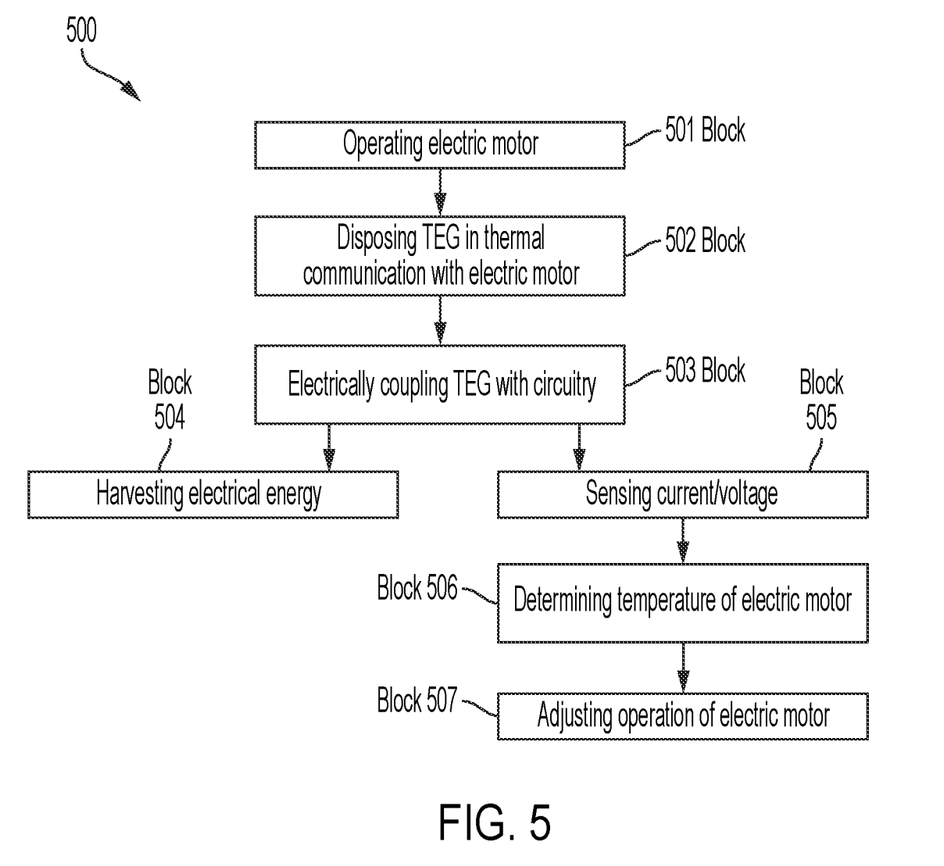
FIG. 5 is a flow diagram illustrating a method of motor temperature control for an electric aircraft in accordance with embodiments.

With reference to FIG. 5, a method 500 of motor temperature control for an electric aircraft is provided. As shown in FIG. 5, the method 500 includes operating an electric motor (block 501) and disposing a TEG in thermal communication with the electric motor (block 502) and electrically coupling the TEG to circuitry (block 503) such that heat generated by the electric motor is converted by the TEG to electrical energy that generates a voltage drop across the circuitry. The method 500 can further include harvesting the electrical energy for operating at least one of on-board aircraft sensors, an aircraft direct current (DC) bus and an aircraft battery (block 504). In addition, the method 500 can include sensing at least one of current applied to the circuitry and the voltage drop across the circuitry (block 505), determining a temperature of the electric motor based on results of the sensing (block 506) and adjusting an operation of the electric motor in accordance with the temperature (block 507).

In an event of the operation of the electric motor being adjusted in accordance with the temperature of block 507 (i.e., by shutting down the electric motor or decreasing power), it is to be understood that any aircraft systems that were powered by the electrical energy generated by the TEG could be affected. In these or other cases, those affected aircraft systems could receive supplemental power from alternative sources, such as the aircraft DC bus and the aircraft battery, or could be themselves powered down or shut off.

Technical effects and benefits of the present disclosure are the provision of TEG material for sensor-less motor temperature monitoring to save cost and weight, for improved thermal management and to make available harvested electrical energy that can be used in various systems such as on-board sensors to thereby reduce power consumption of auxiliary supplies.

The corresponding structures, materials, acts, and equivalents of all means or step-plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A motor temperature control system for an electric aircraft, the motor temperature control system comprising:
   an electric motor;
   circuitry; and
   a thermoelectric generator (TEG) disposed in thermal communication with the electric motor and electrically coupled to the circuitry such that heat generated by the electric motor is converted by the TEG to electrical energy that generates a voltage drop across the circuitry,
   wherein the TEG comprises:
   multiple TEG generator elements; and
   multiple switches electrically interposed between the multiple TEG generator elements,
   the multiple switches being independently operable to arrange at least one or more of the multiple TEG generator elements in series and to arrange at least one or more of the multiple TEG generator elements in parallel.

2. The motor temperature control system according to claim 1, wherein the electric motor drives at least one of aircraft flight controls, aircraft fuel pumps, aircraft oil pumps, aircraft cooling pumps, aircraft landing systems, aircraft cargo management systems and aircraft air management systems.

3. The motor temperature control system according to claim 1, wherein the electric motor comprises a stator housing on which the TEG is mounted.

4. The motor temperature control system according to claim 1, further comprising an electric load disposed along the circuitry.

5. The motor temperature control system according to claim 4, wherein the electric load comprises at least one of on-board aircraft sensors, an aircraft direct current (DC) bus and an aircraft battery.

6. The motor temperature control system according to claim 1, further comprising:
   at least one of a current sensor and a voltage sensor disposed along the circuitry; and a controller operably coupled to the at least one of the current sensor and the voltage sensor and configured to determine a temperature of the electric motor based on readings of the at least one of the current sensor and the voltage sensor and to adjust an operation of the electric motor in accordance with the temperature.

7. The motor temperature control system according to claim 1, wherein the TEG comprises one or more TEG generator elements and each of the one or more TEG generator elements comprises:
a hot side to abut the electric motor;
a cold side opposite the hot side; and
a P-N junction electrically coupled to the circuitry and arranged between the hot side and the cold side to generate voltage to be applied to the circuitry in response to a temperature gradient between the hot side and the cold side.

8. The motor temperature control system according to claim 7, wherein the TEG comprises multiple TEG generator elements in series.

9. The motor temperature control system according to claim 7, wherein the TEG comprises multiple TEG generator elements in parallel.

10. A motor temperature control system for an electric aircraft, the motor temperature control system comprising:
an electric motor disposed on an aircraft to drive at least one of aircraft flight controls, aircraft fuel pumps, aircraft oil pumps, aircraft cooling pumps, aircraft landing systems, aircraft cargo management systems and aircraft air management systems;
circuitry;
an electric load disposed along the circuitry, the electric load comprising at least one of on-board aircraft sensors, an aircraft direct current (DC) bus and an aircraft battery; and
a thermoelectric generator (TEG) disposed in thermal communication with the electric motor and electrically coupled to the circuitry such that heat generated by the electric motor is converted by the TEG to electrical energy that generates a voltage drop across the circuitry,
wherein the TEG comprises:
multiple TEG generator elements; and
multiple switches electrically interposed between the multiple TEG generator elements,
the multiple switches being independently operable to arrange at least one or more of the multiple TEG generator elements in series and to arrange at least one or more of the multiple TEG generator elements in parallel.

11. The motor temperature control system according to claim 10, wherein the electric motor comprises a stator housing on which the TEG is mounted.

12. The motor temperature control system according to claim 10, further comprising:
at least one of a current sensor and a voltage sensor disposed along the circuitry; and
a controller operably coupled to the at least one of the current sensor and the voltage sensor and configured to determine a temperature of the electric motor based on readings of the at least one of the current sensor and the voltage sensor and to adjust an operation of the electric motor in accordance with the temperature.

13. The motor temperature control system according to claim 10, wherein the TEG comprises one or more TEG generator elements and each of the one or more TEG generator elements comprises:
a hot side to abut the electric motor;
a cold side opposite the hot side; and
a P-N junction electrically coupled to the circuitry and arranged between the hot side and the cold side to generate voltage to be applied to the circuitry in response to a temperature gradient between the hot side and the cold side.

14. The motor temperature control system according to claim 13, wherein the TEG comprises multiple TEG generator elements in series.

15. The motor temperature control system according to claim 13, wherein the TEG comprises multiple TEG generator elements in parallel.

16. A method of motor temperature control for an electric aircraft, the method comprising:
operating an electric motor; and
disposing a thermoelectric generator (TEG) in thermal communication with the electric motor and electrically coupling the TEG to circuitry such that heat generated by the electric motor is converted by the TEG to electrical energy that generates a voltage drop across the circuitry,
wherein:
the TEG comprises multiple TEG generator elements and multiple switches electrically interposed between the multiple TEG generator elements, and
the method further comprises independently operating the multiple switches to arrange at least one or more of the multiple TEG generator elements in series and to arrange at least one or more of the multiple TEG generator elements in parallel.

17. The method according to claim 16, further comprising harvesting the electrical energy for operating at least one of on-board aircraft sensors, an aircraft direct current (DC) bus and an aircraft battery.

18. The method according to claim 16, further comprising:
sensing at least one of current applied to the circuitry and the voltage drop across the circuitry;
determining a temperature of the electric motor based on results of the sensing; and
adjusting an operation of the electric motor in accordance with the temperature.

* * * * *